United States Patent
Hintze et al.

(10) Patent No.: US 11,001,921 B2
(45) Date of Patent: May 11, 2021

(54) PROCESSES FOR LOW PRESSURE, COLD BONDING OF SOLID LITHIUM TO METAL SUBSTRATES

(71) Applicant: Albemarle Corporation, Baton Rouge, LA (US)

(72) Inventors: Mark J. Hintze, Charlotte, NC (US); Joseph D. Fickling, Gastonia, NC (US)

(73) Assignee: ALBEMARLE CORPORATION, Charlotte, NC (US)

( * ) Notice: Subject to any disclaimer, the term of this patent is extended or adjusted under 35 U.S.C. 154(b) by 468 days.

(21) Appl. No.: 15/748,543

(22) PCT Filed: Jun. 21, 2016

(86) PCT No.: PCT/US2016/038538
§ 371 (c)(1),
(2) Date: Jan. 29, 2018

(87) PCT Pub. No.: WO2017/011155
PCT Pub. Date: Jan. 19, 2017

(65) Prior Publication Data
US 2018/0223419 A1    Aug. 9, 2018

Related U.S. Application Data

(60) Provisional application No. 62/191,821, filed on Jul. 13, 2015.

(51) Int. Cl.
*H01J 37/34* (2006.01)
*C23C 14/34* (2006.01)
*B32B 15/01* (2006.01)

(52) U.S. Cl.
CPC .......... *C23C 14/3414* (2013.01); *B32B 15/01* (2013.01); *C23C 14/3407* (2013.01); *C23C 14/3464* (2013.01); *H01J 37/3423* (2013.01); *H01J 37/3426* (2013.01); *H01J 37/3435* (2013.01); *H01J 37/3491* (2013.01)

(58) Field of Classification Search
CPC . H01J 37/3491; H01J 37/3423; H01J 37/3435
See application file for complete search history.

(56) References Cited

U.S. PATENT DOCUMENTS

| | | | |
|---|---|---|---|
| 5,230,459 A * | 7/1993 | Mueller | B23K 20/023 204/298.12 |
| 5,830,336 A | 11/1998 | Schultz | |
| 6,039,850 A | 3/2000 | Schultz | |
| 8,864,954 B2 | 10/2014 | Nieh et al. | |
| 2004/0035698 A1* | 2/2004 | Ivanov | B23K 9/0026 204/298.12 |

(Continued)

FOREIGN PATENT DOCUMENTS

| | | |
|---|---|---|
| CN | 104289830 | 10/2014 |
| WO | 2008058171 | 5/2008 |

(Continued)

*Primary Examiner* — Jason Berman
(74) *Attorney, Agent, or Firm* — Marcy M. Hoefling

(57) ABSTRACT

Processes of bonding lithium plates to other metal substrates are provided, using lithium plates preformed with a surface having indentations imposed therein, wherein that surface is placed against the substrate, which reduces the force required to achieve interface bonding.

9 Claims, 3 Drawing Sheets

(56) References Cited

U.S. PATENT DOCUMENTS

Figure 1:
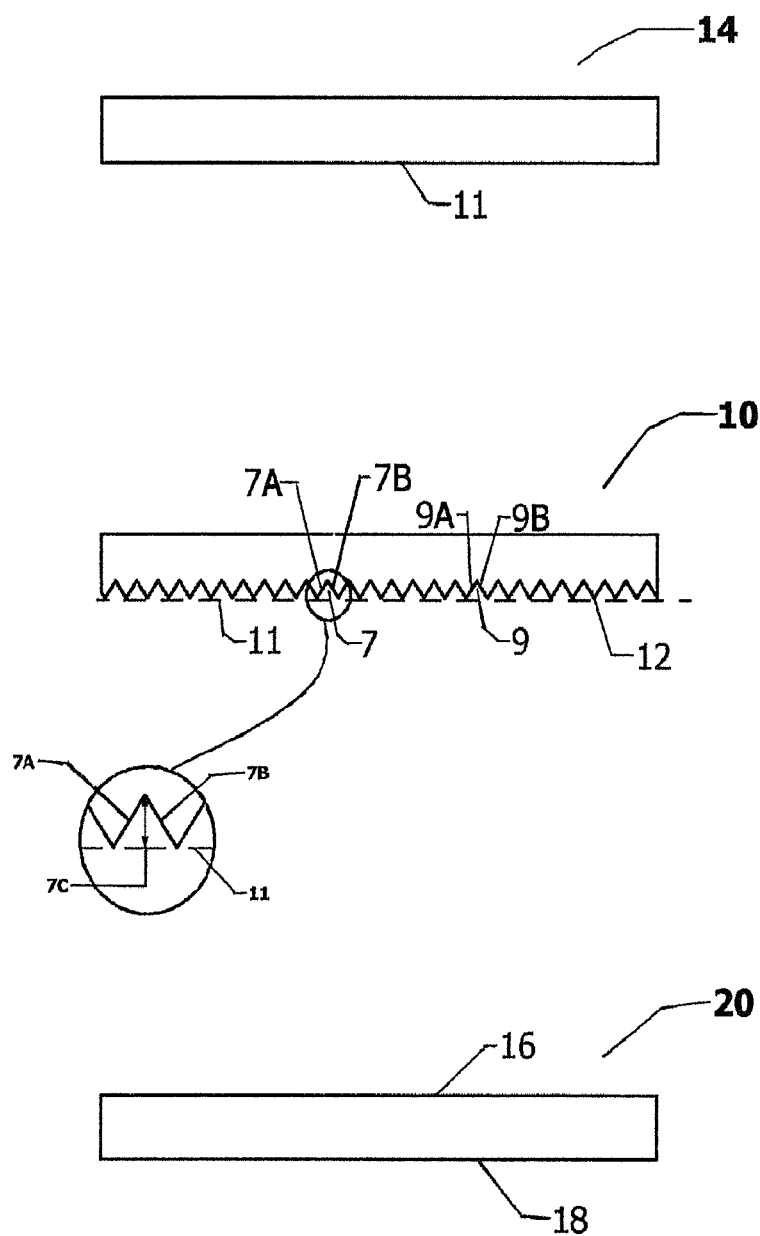

| | | | |
|---|---|---|---|
| 2007/0215463 A1 | 9/2007 | Parkhe | |
| 2009/0045051 A1* | 2/2009 | Ferrasse | C23C 14/3407 |
| | | | 204/298.13 |
| 2013/0161188 A1* | 6/2013 | Linsbod | B21K 25/00 |
| | | | 204/298.12 |
| 2015/0331188 A1* | 11/2015 | Maeda | G02B 6/138 |
| | | | 385/131 |

FOREIGN PATENT DOCUMENTS

| | | |
|---|---|---|
| WO | 2008134516 | 11/2008 |
| WO | 2012145702 | 10/2012 |

* cited by examiner

PROCESSES FOR LOW PRESSURE, COLD BONDING OF SOLID LITHIUM TO METAL SUBSTRATES

BACKGROUND

Developing markets, such as lithium batteries and electrochromic glass, have needs for thin coatings of lithium metal vapor deposited on various materials. Many vapor deposition processes transfer lithium from solid lithium bonded to a metal substrate (a "lithium target") via plasma energy directed onto the lithium surface under controlled vacuum conditions. Due to its relatively low melting point and low mechanical strength, the lithium portion of the lithium target must be firmly attached or bonded to a stronger, electrically conductive substrate with good heat transfer properties to maintain dimensional rigidity and avoid excessive melting. The substrate is usually a metal plate such as copper, stainless steel or titanium. Ideally the substrate should not react or alloy with the lithium to avoid contamination of the lithium.

A suitable lithium target can be made by casting molten lithium onto a metallic substrate in order to achieve a solder type bond. While this process gives acceptable bonding strength, it has several drawbacks. Heating the substrate above the melting point of lithium to assure good wetting can potentially distort the substrate due to thermal stresses. The process of handling molten lithium is further complicated by the necessity to handle it in an inert atmosphere such as a vacuum or argon to avoid contamination and burning of the lithium from reaction with air. Finally as with any casting process, dimensional control is difficult due to volume changes that occur as the lithium changes from a liquid to a solid phase on freezing.

Processes are available for making lithium targets by cold bonding solid lithium plates to a substrate at or near room temperature. Options for cold bonding to form the targets include using adhesives or direct cold welding in which the metals are pressed together under high enough pressure to create mechanical and metallurgical bonds. In some cases subsurface cooling channels in the substrate limit the amount of pressure that can be applied without damaging the substrate. U.S. Pat. No. 8,864,954 cites the use of "adhesion" layers such as indium (In) or epoxy filled with silver (Ag) to attach lithium to substrates. Bonding lithium to substrates with adhesives is challenging due to the excessive reactivity of lithium with common adhesives such as epoxies. These adhesion layers introduce unwanted contaminants to the sputtering process and complicate reclamation of residual lithium from spent targets.

Therefore, there is a need for processes that make lithium targets which do not suffer from the drawbacks of currently available processes.

THE INVENTION

This invention meets the above-described needs by providing processes that comprise contacting a lithium plate surface with a substrate surface under pressure, wherein the lithium plate surface has a plurality of indentations imposed therein, and the process is conducted at ambient conditions, to thereby bond the lithium plate surface to the substrate surface.

Further, this invention provides processes that comprise contacting a lithium plate surface with a substrate surface under pressure, wherein the lithium plate surface has a plurality of indentations imposed therein, and wherein the process is conducted at less than about 80° C. in an air environment having a dew point less than about −35° C., to thereby bond the lithium plate surface to the substrate surface.

Further, this invention provides processes that comprise contacting a lithium plate surface with a substrate surface under pressure, wherein the lithium plate surface has a plurality of indentations imposed therein, and wherein the process is conducted 80° C. or higher in a substantially inert atmosphere, to thereby bond the lithium plate surface to the substrate surface. The substantially inert atmosphere can comprise, for example, argon or a vacuum.

Also provided by this invention are any of the above-described processes wherein each of the plurality of indentations independently has a depth that is at least about 1 mm but not more than about 4 mm into the lithium plate surface. The plurality of indentations preferably creates a total void space in the lithium plate surface of about 20% to about 80%, or about 40% to about 80%, of the total volume of the lithium plate surface involved in forming the bond. As used in describing and claiming this invention, the term "surface" means the portion of the lithium plate or of the substrate that is involved in creating a bond between the lithium plate and the substrate, and the term "plurality" means two or more.

Also provided by this invention are a lithium plate and a substrate bonded according to any process of this invention. The terms "substrate" and "metal substrate" as used herein can mean the same thing. While lithium plates and substrates such as are illustrated by the Figures and described herein are preferred, lithium plates and substrates useful in processes of this invention are not limited to those illustrated and described herein.

As used in describing and claiming this invention, an indentation means a recess into the surface of the lithium plate. The indentation profile can, for example, be a furrowed, corrugated or zigzag (sawtooth) pattern formed by direct extrusion of the lithium plate, or created in a substantially smooth lithium surface by machining, shape rolling or pressing. Surface indentation patterns similar to knurled finishes are also useful in this invention. Other means of imposing indentations into the surface that are familiar to those skilled in the art are also useful in this invention. A surface indentation profile that increases material flow between the lithium plate and the substrate under the pressure required for bonding the lithium plate to the substrate is suitable for use in processes of this invention. The surface indentation profile creates a void space that facilitates lithium flow across the mating substrate surface when the lithium and substrate plates are pressed together. While not wishing to be bound by theory, it is believed this flow breaks up thin lithium oxidation layers allowing non-oxidized, reactive lithium to contact the substrate; and that in so doing, the fresh lithium easily bonds to the clean substrate. To assure adequate flow of the lithium in the bonding zone, the void space is preferably substantially evenly distributed over the lithium surface and comprises about 20% to about 80% of the total volume participating in the bonding during compression.

In processes of this invention, pressure needed to bond the solid lithium surface to the metal substrate surface is reduced as compared to the pressure that would be required for such bonding if the bonding surface of the lithium plate had no indentations imposed therein. The needed pressure can be applied by means known to those skilled in the art, such as by rolling or pressing processes. Those skilled in the art possess the engineering skills needed to determine the amount of pressure adequate to bond a lithium plate surface to a substrate surface.

As will be familiar to those skilled in the art, opposing lithium and metal substrate bonding surfaces should preferably be clean to achieve good bonding. Clean lithium surfaces can be provided by using freshly extruded plates processed in a dry room (dew point less than −35° C.). Time of exposure to dry room air should preferably be less than 24 hours before bonding to the substrate. The metal substrate should preferably have a dry machined surface cleaned with degreasing solvents to remove residual oil just prior to bonding. Clean, mildly abrasive pads, such as SCOTCH-BRITE, or cloths may be used to lightly roughen the surface and aid in removal of surface contaminants. Cleaning should preferably be done in a dry room (dew point less than about −35° C.) within one hour of performing the bonding process.

FIGURES

The invention will be better understood by reference to the Figures in which:

FIG. 1 provides cross section or end views of two lithium plates, one according to this invention and one that has been previously known.

Figure 2:
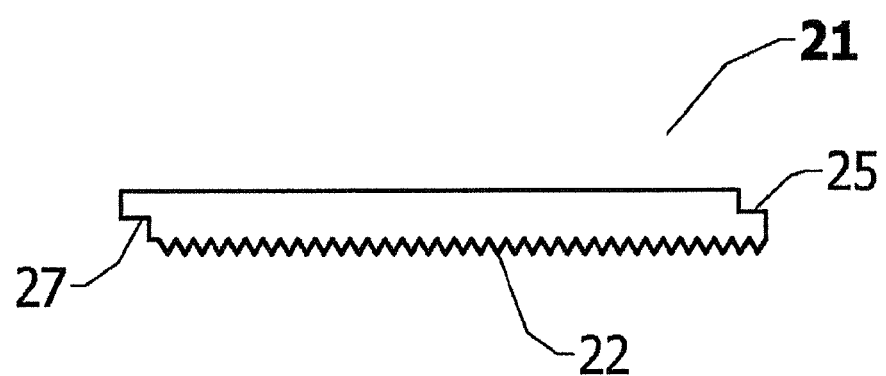

FIG. 2 provides a schematic of an extruded lithium plate with one furrowed surface and stepped edges for forming lap joints with similar adjoining plates.

Figure 3:
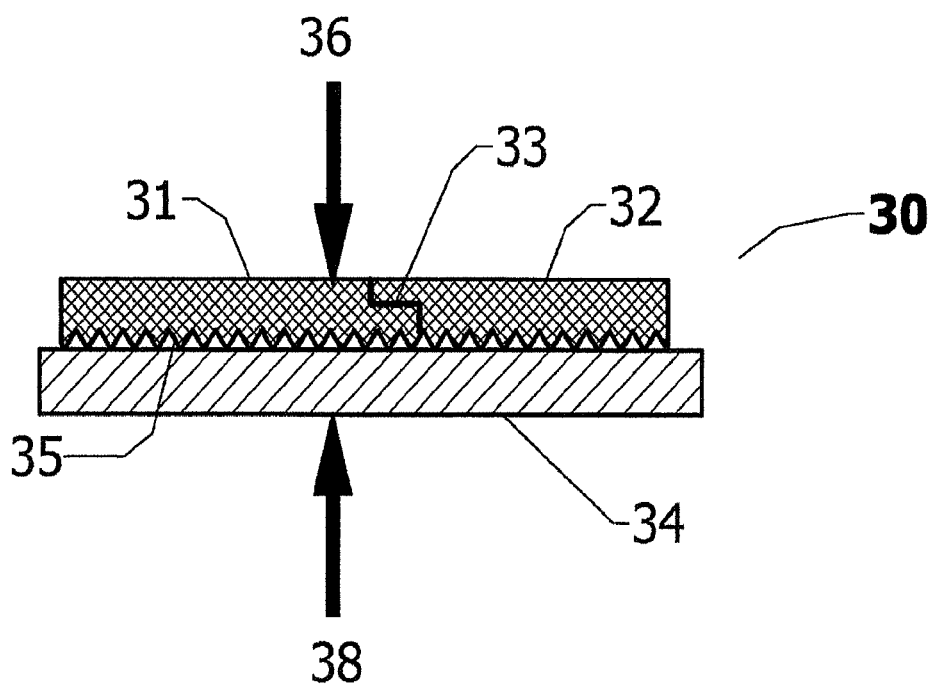
Figure 3:
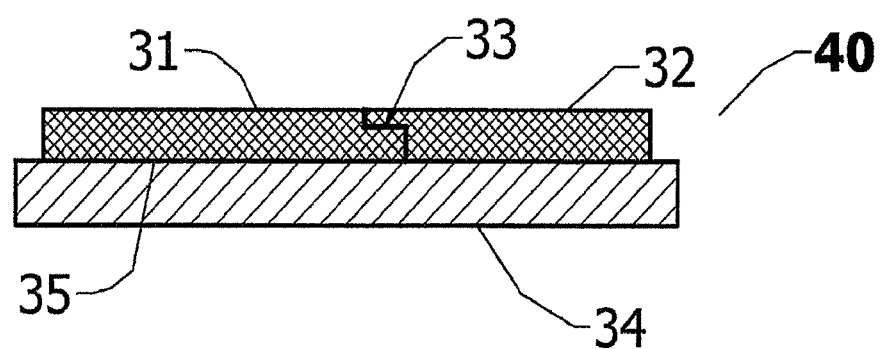

FIG. 3 provides schematics of lithium and substrate plates before and after pressing.

DETAILED DESCRIPTION

Referring to FIG. 1, a lithium plate 10 according to this invention has a surface 12 having a plurality of indentations imposed therein, e.g., indentations 7 and 9. Dashed line 11, which extends the width of lithium plate 10, illustrates where the surface 12 was located prior to imposition of the plurality of indentations. See also the lithium plate 14, which represents the lithium plate 10 prior to imposition of the plurality of indentations therein, and has the surface 11. Each of the plurality of indentations, e.g., 7 and 9, creates a void space defined by dashed line 11 and the indented surfaces that are imposed into surface 12, e.g., indented surfaces 7A and 7B, and indented surfaces 9A and 9B. Each indentation has a depth, which is defined by the length of a line perpendicular to dashed line 11, and extending from dashed line 11 to the point of the indentation that extends most deeply into lithium plate 10, e.g., line 7C in regard to indentation 7 (as is illustrated in the enlargement of indentation 7). Each void space has a length which extends the length of its associated indentation, or the length of lithium plate 10, whichever is shorter. The previously known lithium plate 20 has surface 16 and surface 18, neither of which has indentations imposed therein.

FIG. 2 provides a schematic of an extruded lithium plate 21 with one furrowed surface 22, i.e., a surface 22 having a plurality of indentations imposed therein, and stepped edges 25 and 27, which can be useful for forming lap joints with similar adjoining plates to create wider targets.

FIG. 3 provides a schematic 30, showing lithium plates 31 and 32, joined at lap joint 33, and having furrowed surface 35 with indentations imposed therein—and of substrate plate 34—before the joined lithium plates 31 and 32 are pressed onto substrate plate 34. Arrows 36 and 38 show the directions that pressing is to be imposed. FIG. 3 also provides a schematic 40, showing lithium plates 31 and 32, joined at lap joint 33, and bonded at surface 35 with substrate plate 34 after the joined lithium plates 31 and 32 are pressed onto substrate plate 34. The furrowed lithium surface 35 flowed to a flattened lithium surface 35 during the pressing process. The lap joint 33 between adjacent plates 31 and 32 is compressed by the pressing to form a tight lap joint 33.

EXAMPLES

The following examples are illustrative of the principles of this invention. It is understood that this invention is not limited to any one specific embodiment exemplified herein, whether in the examples or the remainder of this patent application.

Example 1

In accordance with this invention, two plates of lithium, 13 mm thick×149 mm wide, were extruded with a furrowed surface on one side and a step along both edges as shown in FIG. 2. The furrows (a.k.a., indentions) had a depth of 3 mm. The two plates were adjoined to form a lap joint by overlapping the stepped edges creating an assembly that is 282 mm wide. The furrowed side was placed against a 9 mm thick 304 stainless steel substrate. The stainless steel substrate was cleaned by buffing with a SCOTCH-BRITE pad followed by wiping with a clean cloth dampened with hexane just prior to laying the lithium plate against it. The assembly was positioned between platens of a hydraulic press and progressively pressed with 100 mm long bites at a force of 44,482 N generating a stress on the lithium of 1.6 N/mm2 (1.6 MPa). The pressing reduced the lithium thickness to 11.3 mm. Pressing was done within 4 hours of extruding the lithium to minimize surface oxidation. All processes were performed in a dry room at 20° C. with a dew point of less than −35° C. The resulting plates were fully bonded as determined by attempts to pull the plates apart by hand.

Example 2

In accordance with this invention, two, 10.4 mm thick× 149 mm wide, plates of lithium were extruded with a furrowed surface on one side and a step, 6 mm×5 mm deep, along both edges. The furrows (a.k.a., indentions) had a depth approximately 3 mm. The steps along the edges allowed the two plates to be adjoined in a manor to form a lap joint and thus create a plate approximately 282 mm wide. The furrowed side was placed against a 9 mm thick titanium substrate. The titanium substrate was cleaned by buffing with a SCOTCH-BRITE pad followed by wiping with a clean cloth dampened with hexane just prior to laying the lithium plate against it. The lithium/titanium plate assembly was heated to 60° C. by an electrically heated aluminum support plate. The entire assembly was positioned between platens of a hydraulic press and progressively pressed with 100 mm long bites at a force of 44,482 N generating a stress on the lithium of 1.6 N/mm2 (1.6 MPa). All processes were performed in a dry room with a dew point of <−35° C. Pressing was done within 4 hours of extruding the lithium to minimize surface oxidation. The resulting plates were fully bonded as determined by attempts to pull the plates apart by hand.

Example 3

In accordance with this invention, two, 17.1 mm thick×96 mm wide, plates of lithium were extruded with a furrowed surface on one side and a step, 3.2 mm×8.5 mm deep, along both edges. The furrows (a.k.a., indentions) had a depth approximately 3 mm. The steps along the edges allowed the two plates to be adjoined in a manor to form a lap joint and thus create a plate approximately 192 mm wide. The furrowed side was placed against a 9.5 mm thick copper substrate. The copper substrate was cleaned by buffing with a clean cloth dampened with hexane just prior to laying the lithium plate against it. The entire assembly was positioned between platens of a hydraulic press and progressively pressed with 100 mm long bites at a force of 105,000 N generating a stress on the lithium of 5.4 N/mm2 (5.4 MPa). All processes were performed in a dry room at 20° C. with a dew point of <−35° C. Pressing was done within 4 hours of extruding the lithium to minimize surface oxidation. The resulting plates were fully bonded as determined by attempts to pull the plates apart by hand.

This invention is advantageous in that the provided processes of cold bonding lithium plates to other metal substrates reduces the amount of pressure normally required for good bonding using previously known bonding procedures. Lithium plates preformed with a furrowed surface placed against the substrate reduces the force required to achieve interface bonding by allowing space for lithium to flow and enable non-oxidized lithium to contact the substrate. The pressures for deforming the lithium in this bonding process can be further reduced by heating the lithium/substrate to temperatures below the melting point of lithium. Multiple narrow plates of lithium may also be assembled to create wide plates in such a cold bonding process by using lap joints or other interlocking seams.

While the present invention has been described in terms of one or more preferred embodiments, it is to be understood that other modifications may be made without departing from the scope of the invention, which is set forth in the claims below.

What is claimed is:

1. A process comprising contacting a lithium plate surface with a substrate surface, wherein the lithium plate surface has a plurality of indentations imposed therein, and the contacting is conducted under pressure at ambient conditions such that the lithium plate surface is substantially flattened, to thereby bond the lithium plate surface to the substrate surface.

2. The process of claim 1 wherein each of the plurality of indentations independently has a depth that is at least about 1 mm but not more than about 4 mm into the lithium plate surface.

3. The process of claim 1 wherein the plurality of indentations creates a total void space in the lithium plate surface of about 20% to about 80% of the total volume of the lithium plate surface involved in forming the bond.

4. A process comprising contacting a lithium plate surface with a substrate surface, wherein the lithium plate surface has a plurality of indentations imposed therein, and wherein the contacting is conducted under pressure at less than about 80° C. in an environment having a dew point less than about −35° C. such that the lithium plate surface is substantially flattened, to thereby bond the lithium plate surface to the substrate surface.

5. The process of claim 4 wherein each of the plurality of indentations independently has a depth that is at least about 1 mm but not more than about 4 mm into the lithium plate surface.

6. The process of claim 4 wherein the plurality of indentations creates a total void space in the lithium plate surface of about 20% to about 80% of the total volume of the lithium plate surface involved in forming the bond.

7. A process comprising contacting a lithium plate surface with a substrate surface, wherein the lithium plate surface has a plurality of indentations imposed therein, and wherein the contacting is conducted under pressure at about 80° C. or higher in a substantially inert atmosphere comprising argon such that the lithium plate surface is substantially flattened, to thereby bond the lithium plate surface to the substrate surface.

8. The process of claim 7 wherein each of the plurality of indentations independently has a depth that is at least about 1 mm but not more than about 4 mm into the lithium plate surface.

9. The process of claim 7 wherein the plurality of indentations creates a total void space in the lithium plate surface of about 20% to about 80% of the total volume of the lithium plate surface involved in forming the bond.

* * * * *